United States Patent
Gathman et al.

(10) Patent No.: US 10,630,328 B2
(45) Date of Patent: Apr. 21, 2020

(54) CURRENT-MODE FILTERING USING CURRENT STEERING

(71) Applicant: Qualcomm Incorporated, San Diego, CA (US)

(72) Inventors: Timothy Donald Gathman, San Diego, CA (US); Chirag Dipak Patel, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/058,944

(22) Filed: Aug. 8, 2018

(65) Prior Publication Data

US 2020/0052729 A1 Feb. 13, 2020

(51) Int. Cl.
| | | |
|---|---|---|
| H03D 1/06 | (2006.01) | |
| H04B 1/10 | (2006.01) | |
| H03F 3/19 | (2006.01) | |
| H03H 11/04 | (2006.01) | |
| H04B 1/00 | (2006.01) | |

(52) U.S. Cl.
CPC ............. *H04B 1/1036* (2013.01); *H03F 3/19* (2013.01); *H03H 11/0427* (2013.01); *H04B 1/005* (2013.01)

(58) Field of Classification Search
CPC ......... H04B 1/1036; H04B 1/005; H03F 3/19; H03H 11/0427
USPC .......................................................... 375/346
See application file for complete search history.

(56) References Cited

U.S. PATENT DOCUMENTS

| | | | | |
|---|---|---|---|---|
| 4,959,859 A | * | 9/1990 | Manlove | H04B 1/1676 381/10 |
| 5,572,347 A | * | 11/1996 | Burton | H04N 7/17318 348/E7.071 |
| 5,594,576 A | * | 1/1997 | Sutherland | H04Q 11/0067 398/164 |
| 9,054,748 B2 | | 6/2015 | Mo et al. | |
| 9,059,766 B2 | | 6/2015 | Rahman et al. | |
| 2006/0132191 A1 | * | 6/2006 | Palmer | G11C 7/1078 327/52 |

(Continued)

FOREIGN PATENT DOCUMENTS

WO 2015153311 A1 10/2015

OTHER PUBLICATIONS

Codega N., et al., "A Low Out-of-Band Noise LTE Transmitter with Current-Mode Approach," IEEE Proceedings of the ESSCIRC, 2013, pp. 283-286.

*Primary Examiner* — Helene E Tayong
(74) *Attorney, Agent, or Firm* — Colby Nipper/Qualcomm

(57) ABSTRACT

An apparatus is disclosed for current-mode filtering using current steering. In an example aspect, the apparatus includes a filter. The filter includes a current-steering node, a first output node, a second output node, a wideband path, and a narrowband path. The wideband path is coupled between the current-steering node and the first output node. The wideband path includes a wideband low-pass filter configured to pass frequencies within a wide passband. The narrowband path is coupled between the current-steering node and the second output node. The narrowband path includes a narrowband low-pass filter configured to pass a portion of the frequencies that are within a narrow passband.

28 Claims, 13 Drawing Sheets

(56) References Cited

U.S. PATENT DOCUMENTS

| | | | |
|---|---|---|---|
| 2006/0135109 A1* | 6/2006 | Klumperink | H03D 7/1441 455/323 |
| 2008/0024951 A1* | 1/2008 | Mortensen | H02M 1/44 361/118 |
| 2015/0280673 A1 | 10/2015 | Tasic et al. | |
| 2018/0048293 A1 | 2/2018 | Gathman et al. | |

* cited by examiner

CURRENT-MODE FILTERING USING CURRENT STEERING

TECHNICAL FIELD

This disclosure relates generally to wireless transceivers and, more specifically, to a hybrid current-mode filter having a narrowband low-pass filter response, a wideband low-pass filter response, or a band-pass filter response through current steering.

BACKGROUND

Electronic devices use radio-frequency (RF) signals to communicate information. These radio-frequency signals enable users to talk with friends, download information, share pictures, remotely control household devices, and receive global positioning information. Different frequencies may be available for transmitting the radio-frequency signals based on a network provider's frequency spectrum allocation. However, frequency spectrum allocations tend to be segmented. This means that the network provider may be allocated different-sized portions of the frequency spectrum and that the different-sized portions may be non-contiguous (e.g., separated by a frequency spectrum allocation of another network provider). To transmit or receive within a given frequency spectrum allocation, the electronic device may use filters to pass signals within the frequency spectrum allocation and to suppress (e.g., attenuate) other jammers or noise having frequencies outside of the frequency spectrum allocation.

Based on the frequency spectrum allocation, a network provider may increase data rates (e.g., throughput) by utilizing larger bandwidth radio-frequency signals with a wideband portion of the frequency spectrum allocation or with carrier aggregation that combines multiple contiguous or non-contiguous portions of the frequency spectrum. Some electronic devices may therefore incorporate multiple receivers, which are individually designed to process communication signals of different bandwidths or individual signals for carrier aggregation. The use of multiple receivers, however, increases the size and cost of the electronic device as bandwidth-specific components, such as filters, are included in multiple instances. Consequently, this approach may be impractical for mobile devices that place a premium on small size and low weight.

SUMMARY

An apparatus is disclosed that implements current-mode filtering using current steering. The described techniques implement a hybrid current-mode filter, which is reconfigurable for a variety of different bandwidths. The hybrid current-mode filter comprises a reconfigurable baseband filter, which can act as a narrowband low-pass filter, a wideband low-pass filter, or a band-pass filter. In this way, the hybrid current-mode filter can pass narrow-bandwidth signals for second-generation (2G), third-generation (3G), or fourth-generation (4G) modes, wide-bandwidth signals for fifth-generation (5G) modes, or contiguous and non-contiguous signals for carrier aggregation (CA), which may be used in some 4G or 5G modes. The hybrid current-mode filter comprises a wideband path with a wideband low-pass filter and a narrowband path with a narrowband low-pass filter. The wideband low-pass filter and the narrowband low-pass filter have different impedances, which enable the wideband path and the narrowband path to steer different portions of an input current to the wideband low-pass filter or the narrowband low-pass filter.

Through current steering, at least two contiguous or non-contiguous signals can be passed by the hybrid current-mode filter (e.g., two via the wideband path and one via the narrowband path). The hybrid current-mode filter can also adjust amplitudes of the signals to cause them to be relatively similar, which improves a signal-to-noise ratio for carrier aggregation. The current steering can also be used to notch out a low-frequency portion of a frequency spectrum. In this way, jammers (e.g., spurious or undesired signals) that exist between the two non-contiguous signals are steered to the narrowband path while the two non-contiguous signals are steered to the wideband path. In some implementations, the narrowband path is disconnected to enable wide-bandwidth signals to be steered to the wideband low-pass filter via the wideband path. Through use of the hybrid current-mode filter, a single receiver can process a variety of different types of signals, thereby conserving space and reducing cost of a wireless communication device.

In an example aspect, an apparatus is disclosed. The apparatus includes a filter including a current-steering node, a first output node, a second output node, a wideband path, and a narrowband path. The wideband path is coupled between the current-steering node and the first output node. The wideband path includes a wideband low-pass filter configured to pass frequencies within a wide passband. The narrowband path is coupled between the current-steering node and the second output node. The narrowband path includes a narrowband low-pass filter configured to pass a portion of the frequencies that are within a narrow passband.

In an example aspect, an apparatus is disclosed. The apparatus includes a filter. The filter includes a current-steering node, a first output node, a second output node, a wideband path coupled between the current-steering node and the first output node, and a narrowband path coupled between the current-steering node and the second output node. The current-steering node is configured to accept an input current comprising at least a high-frequency narrowband signal and a low-frequency narrowband signal. The filter also includes impedance means for steering the high-frequency narrowband signal and the low-frequency narrowband signal to the wideband path and the narrowband path, respectively.

In an example aspect, a method for current-mode filtering using current steering is disclosed. The method includes accepting an input current comprising at least a high-frequency narrowband signal and a low-frequency narrowband signal at a current-steering node. The method also includes steering the high-frequency narrowband signal to a wideband path that is coupled between the current-steering node and a first output node. The method additionally includes steering the low-frequency narrowband signal to a narrowband path that is coupled between the current-steering node and a second output node. The method further includes passing the high-frequency narrowband signal to the first output node and passing the low-frequency narrowband signal to the second output node.

In an example aspect, an apparatus is disclosed. The apparatus includes an antenna and a receiver. The receiver includes a low-noise amplifier coupled to the antenna, a mixer coupled to the low-noise amplifier, and at least one analog-to-digital converter. The receiver also includes a filter, which includes a current-steering node coupled to the mixer, a wideband path, a narrowband path, and at least one output node respectively coupled to the at least one analogto-digital converter. The wideband path and the narrowband path are coupled between the current-steering node and the at least one output node. The filter is configured to selectively have a wideband low-pass response via the wideband path at a first time and a narrowband low-pass response via the narrowband path at a second time.

BRIEF DESCRIPTION OF DRAWINGS

FIG. 3-1 illustrates example low-pass responses of a hybrid current-mode filter for current-mode filtering using current steering.

FIG. 3-2 illustrates example band-pass responses of a hybrid current-mode filter for current-mode filtering using current steering.

FIG. 3-3 illustrates other example responses of a hybrid current-mode filter for current-mode filtering with switching.

FIG. 7-1 illustrates an example hybrid current-mode filter including a switch for current-mode filtering using current steering.

FIG. 7-2 illustrates an example hybrid current-mode filter including two switches for current-mode filtering using current steering.

FIG. 8-1 illustrates an example hybrid current-mode filter including a low-pass filter for current-mode filtering using current steering.

FIG. 8-2 illustrates another example hybrid current-mode filter including a low-pass filter for current-mode filtering using current steering.

DETAILED DESCRIPTION

Figure 1:
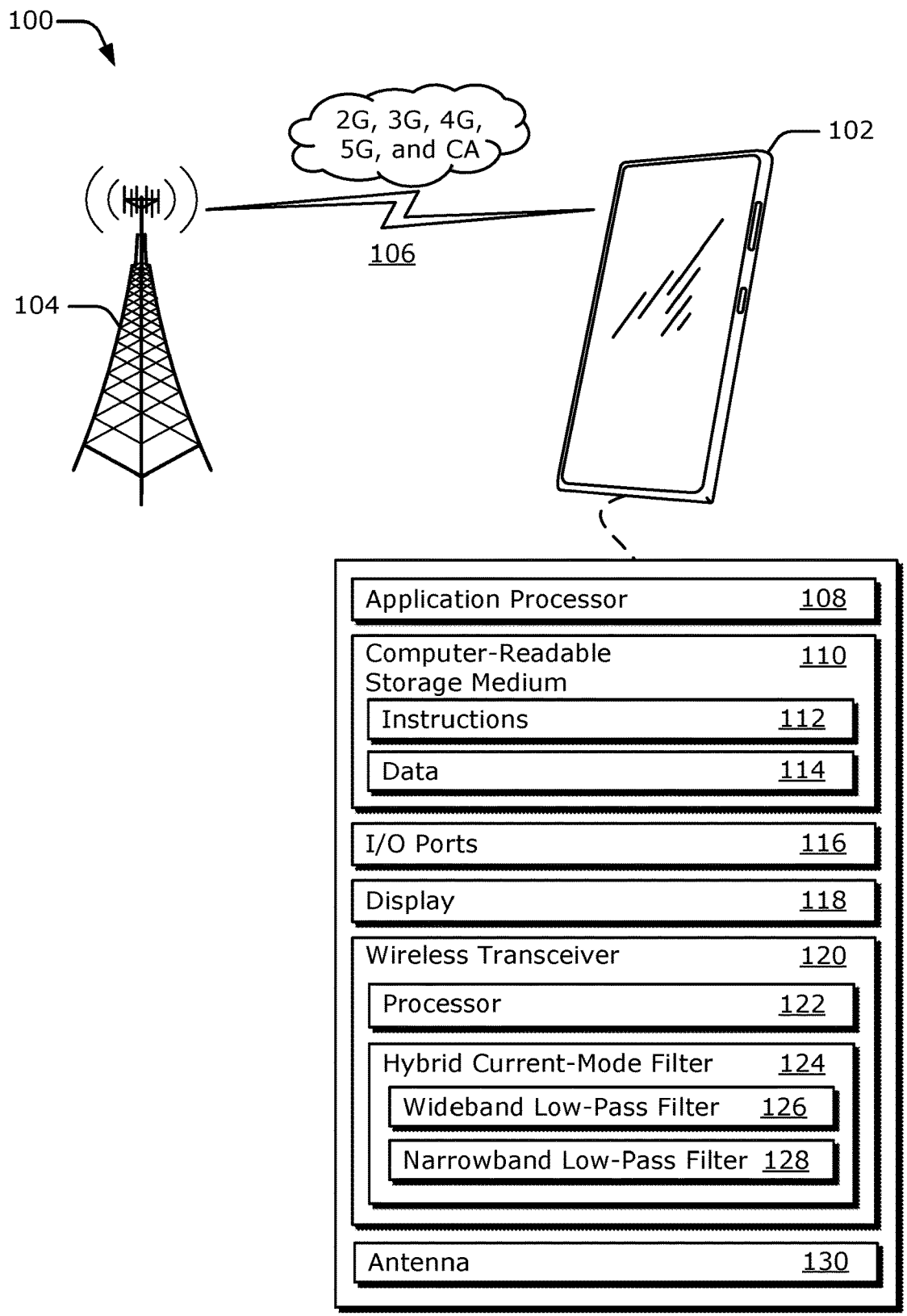
FIG. 1 illustrates an example environment for current-mode filtering using current steering.

Increased data rates and network capacities are challenging to realize. One way to increase data rates involves utilizing wide-bandwidth signals or two or more contiguous signals in the case of contiguous carrier aggregation. It is challenging, however, to design a wide-bandwidth filter that can pass these signals. Narrowband current-mode filters that utilize close-loop feedback, for example, cannot readily be reconfigured for wider bandwidths due to degradations in filter stability resulting from the closed-loop feedback and wide bandwidth. Other wideband filter architectures utilize a voltage-mode filter. The voltage-mode filter, however, can have poor linearity and noise performance and may consume additional power relative to the narrowband current-mode filter.

Another way to increase data rates involves performing non-contiguous carrier aggregation. While a wideband filter may have sufficient bandwidth to pass two or more non-contiguous signals, any jammer that may exist between two non-contiguous signals may also be passed. As a result, the jammer may desensitize a receiver and degrade the fidelity of the received signal.

To address differences in network coverage, some electronic devices may support multiple wireless communication standards by implementing multiple bandwidth-specific receivers. Because each receiver utilizes bandwidth-specific components, such as filters, the use of multiple receivers increases area and cost of an electronic device as the bandwidth-specific component are included in multiple instances.

In contrast, techniques for current-mode filtering using current steering are described herein. The described techniques implement a hybrid current-mode filter, which is reconfigurable for a variety of different bandwidths. The hybrid current-mode filter is a reconfigurable baseband filter, which can act as a narrowband low-pass filter, a wideband low-pass filter, or a band-pass filter. In this way, the hybrid current-mode filter can pass narrow-bandwidth (e.g., narrowband) signals for second-generation (2G), third-generation (3G), or fourth-generation (4G) modes, wide-bandwidth (e.g., wideband) signals for fifth-generation (5G) modes, or contiguous and non-contiguous signals for signal aggregation (CA), which may be used in some 4G or 5G modes. Although these signals may be associated with different communication modes, these communication modes may utilize similar radio frequencies, such as frequencies between 1 gigahertz (GHz) and 6 GHz (e.g., 2G bands, 3G bands, 4G bands, and sub-6 GHz 5G bands). The hybrid current-mode filter comprises a wideband path with a wideband low-pass filter and a narrowband path with a narrowband low-pass filter. The wideband low-pass filter and the narrowband low-pass filter have different impedances, which enable the wideband path and the narrowband path to steer different portions of an input current to the wideband low-pass filter or the narrowband low-pass filter.

Through current steering, at least two contiguous or non-contiguous signals can be passed by the hybrid current-mode filter (e.g., two via the wideband path and one via the narrowband path). The hybrid current-mode filter can also adjust amplitudes of the signals to cause them to be relatively similar, which improves a signal-to-noise ratio for carrier aggregation. The current steering can also be used to notch out a low-frequency portion of a frequency spectrum. In this way, jammers (e.g., spurious or undesired signals) that exist between the two non-contiguous signals are steered to the narrowband path while the two non-contiguous signals are steered to the wideband path. In some implementations, the narrowband path is disconnected to enable wide bandwidth signals to be steered to the wideband low-pass filter via the wideband path. Through use of the hybrid current-mode filter, a single receiver can process a variety of different types of signals, thereby conserving space and reducing cost of a wireless communication device. Furthermore, the hybrid current-mode filter enables the single receiver to realize higher throughput with carrier aggregation.

FIG. 1 illustrates an example environment 100 for current-mode filtering using current steering. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber-optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as 2G, 3G, 4G, 5G, IEEE 802.11, IEEE 802.16, Bluetooth™, and so forth. The wireless link 106 may also be implemented using carrier aggregation (CA) (contiguous or non-contiguous) to increase data rates and improve network performance. In some implementations, instead of or in addition to providing a data link, the wireless link 106 may wirelessly provide power and the base station 104 may comprise a power source.

The computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting and receiving communication signals via an antenna 130. Components of the wireless transceiver 120 can include amplifiers, switches, mixers, analog-to-digital converters, filters, and so forth for conditioning the communication signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receiver chains). In general, the wireless transceiver 120 processes data and/or signals associated with communicating data of the computing device 102 over the antenna 130.

The wireless transceiver 120 includes a processor 122 and a hybrid current-mode filter 124. The processor 122, which can be implemented as a modem, controls the wireless transceiver 120 and enables wireless communication to be performed. In general, the processor 122 can be implemented within or separate from the wireless transceiver 120 and can include a portion of the CRM 110 or have access to the CRM 110 to obtain computer-readable instructions. Baseband circuitry may also be included within the processor 122 to perform high-rate sampling processes that can include analog-to-digital conversion, digital-to-analog conversion, gain correction, skew correction, frequency translation, and so forth. The processor 122 can also process a baseband version of a signal accepted from the wireless transceiver 120 to generate data, which can be provided to other parts of the computing device 102 via a communication interface for wireless communication.

The wireless transceiver 120 can also include a controller (not shown). The controller can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, the processor and associated instructions can be realized in separate circuitry, fixed logic circuitry, hard-coded logic, and so forth. The controller can be implemented as part of the wireless transceiver 120, the processor 122, the application processor 108, a general-purpose processor, some combination thereof, and so forth.

The hybrid current-mode filter 124 comprises a reconfigurable baseband filter that has a narrowband low-pass filter response, a wideband low-pass filter response, or a band-pass filter response to pass a variety of different signals, including narrowband signals (e.g., those used for 2G, 3G, or 4G modes), wideband signals (e.g., those used for 5G modes), or signals used for carrier aggregation (e.g., contiguous signals or non-contiguous signals). Each signal is associated with a frequency channel and includes multiple frequencies based on a center frequency and a bandwidth of the signal. The narrowband signals may have narrow bandwidths on the order of hundreds of kilohertz (kHz) to tens of megahertz (MHz) (e.g., between approximately 100 kHz and 100 MHz or less than approximately 100 MHz). In comparison, the wideband signals may have wide bandwidths on the order of hundreds of megahertz (MHz) or a few gigahertz (GHz) (e.g., greater than approximately 100

MHz or between approximately 400 MHz and 4 GHz). Because the hybrid current-mode filter 124 can pass a variety of different signals, the wireless transceiver 120 can include a single receiver chain instead of implementing multiple receiver chains each having a different filter. This saves cost and conserves space (e.g., silicon area) within the wireless transceiver 120. As a current-mode filter, the hybrid current-mode filter 124 provides a filtered output based on an input current. The hybrid current-mode filter 124 includes a wideband low-pass filter 126 and a narrowband low-pass filter 128, which steer different portions of the input current. The hybrid current-mode filter 124 can at least partially implement current-mode filtering using current steering, as further described in FIG. 4.

Figure 2:
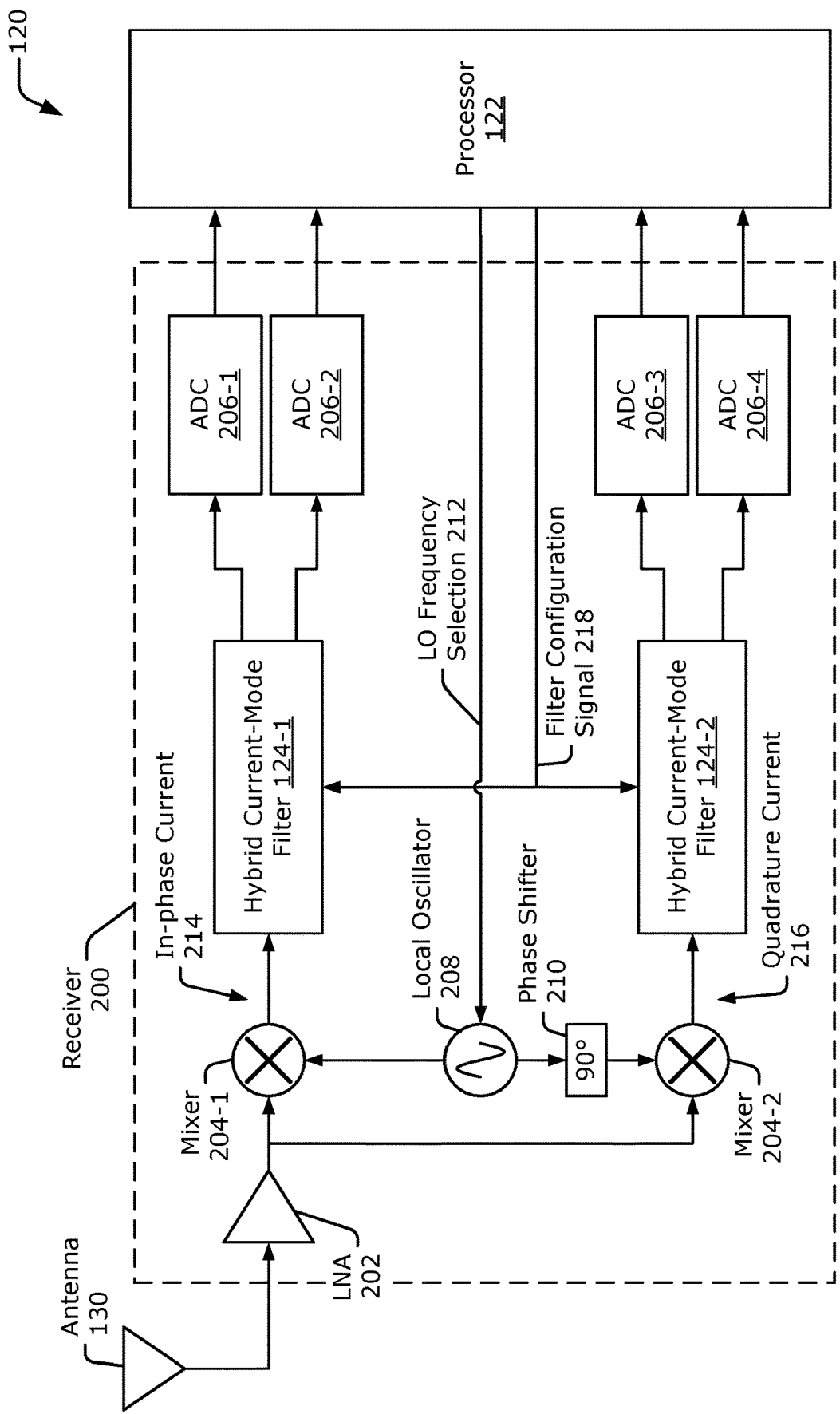
FIG. 2 illustrates a portion of an example wireless transceiver for current-mode filtering using current steering.

FIG. 2 illustrates a portion of an example wireless transceiver 120 for current-mode filtering using current steering. The wireless transceiver 120 includes a receiver 200, which is implemented as a direct-conversion receiver (e.g., a homodyne receiver or a zero intermediate-frequency (ZIF) receiver) or a heterodyne receiver having one or more downconversion stages to transition from a radio-frequency domain to a baseband domain. The receiver 200 is coupled between the antenna 130 and the processor 122 and receives communication signals that are provided via the wireless link 106.

In the depicted configuration, the receiver 200 includes a low-noise amplifier (LNA) 202, two mixers 204-1 and 204-2, two hybrid current-mode filters 124-1 and 124-2, four analog-to-digital converters (ADCs) 206-1, 206-2, 206-3, and 206-4, a local oscillator 208, and a phase shifter 210. The hybrid current-mode filter 124-1 is coupled between the mixer 204-1 and the two analog-to-digital converters 206-1 and 206-2. Likewise, the hybrid current-mode filter 124-2 is coupled between the mixer 204-2 and the other two analog-to-digital converters 206-3 and 206-4. Example implementations of the hybrid current-mode filters 124-1 or 124-2 are further described with respect to FIGS. 4, 7-1, 7-2, 8-1, and 8-2.

The antenna 130 provides a current to the low-noise amplifier 202. The current may be associated with a narrowband signal, a wideband signal, or multiple non-contiguous signals. The low-noise amplifier 202 amplifies the current and the mixers 204-1 and 204-2 downconvert the current from radio frequencies to baseband frequencies using a local oscillator signal generated via the local oscillator 208. A frequency of the local oscillator signal is based on a local oscillator frequency selection 212, which is provided via the processor 122. The mixers 204-1 and 204-2, the phase shifter 210, and the local oscillator 208 together implement an in-phase and quadrature (I/Q) mixer (e.g., an I/Q demodulator), which generates an in-phase current 214 and a quadrature current 216 that are respectively provided to the hybrid current-mode filters 124-1 and 124-2. Although not explicitly shown, the in-phase current 214 and the quadrature current 216 may each comprise differential currents. In general, the receiver 200 can include any number of hybrid current-mode filters 124 to support any number channels, such as the two hybrid current-mode filters 124 for the two in-phase and quadrature channels shown in FIG. 2.

The hybrid current-mode filters 124-1 and 124-2 pass the wideband signal, the narrowband signal, or the multiple non-contiguous signals based on a filter configuration signal 218, which is provided via the processor 122. The filter configuration signal 218 enables the processor 122 to control the filter response of the hybrid current-mode filters 124-1 and 124-2 to pass the desired signals. These signals are digitized via the analog-to-digital converters 206-1, 206-2, 206-3, and 206-4 and provided to the processor 122 for further processing. The analog-to-digital converters 206-1, 206-2, 206-3, and 206-4 may be configured to accept current-mode inputs or voltage-mode inputs depending on an output configuration of the hybrid current-mode filters 124-1 or 124-2.

As shown in FIG. 2, the hybrid current-mode filters 124-1 and 124-2 enable the wireless transceiver 120 to include a single receiver 200 and reuse components, such as the low-noise amplifier 202 and the mixers 204-1 and 204-2. For example, the antenna 130 receives a wideband signal and multiple non-contiguous signals at different times. The low-noise amplifier 202 and the mixers 204-1 and 204-2 have sufficient bandwidth to respectively provide amplification and downconversion for processing both the wideband signal and multiple non-contiguous signals. Depending on an available frequency spectrum allocation, the processor 122 can customize the local oscillator frequency selection 212 and the filter configuration signal 218 to increase data rates, as shown in FIGS. 3-1, 3-2, and 3-3.

Figures 1, 3:
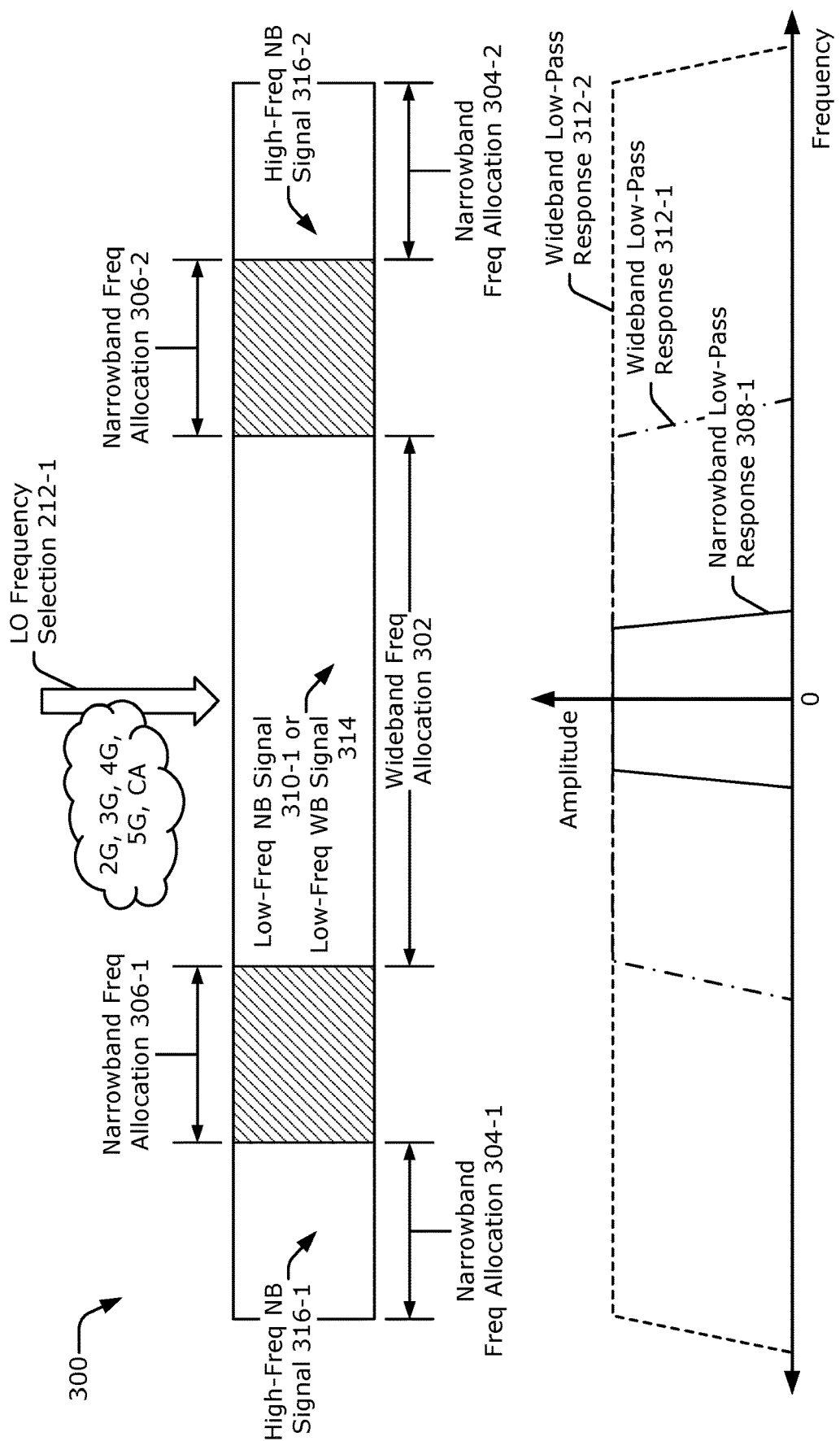
Figures 2, 3:
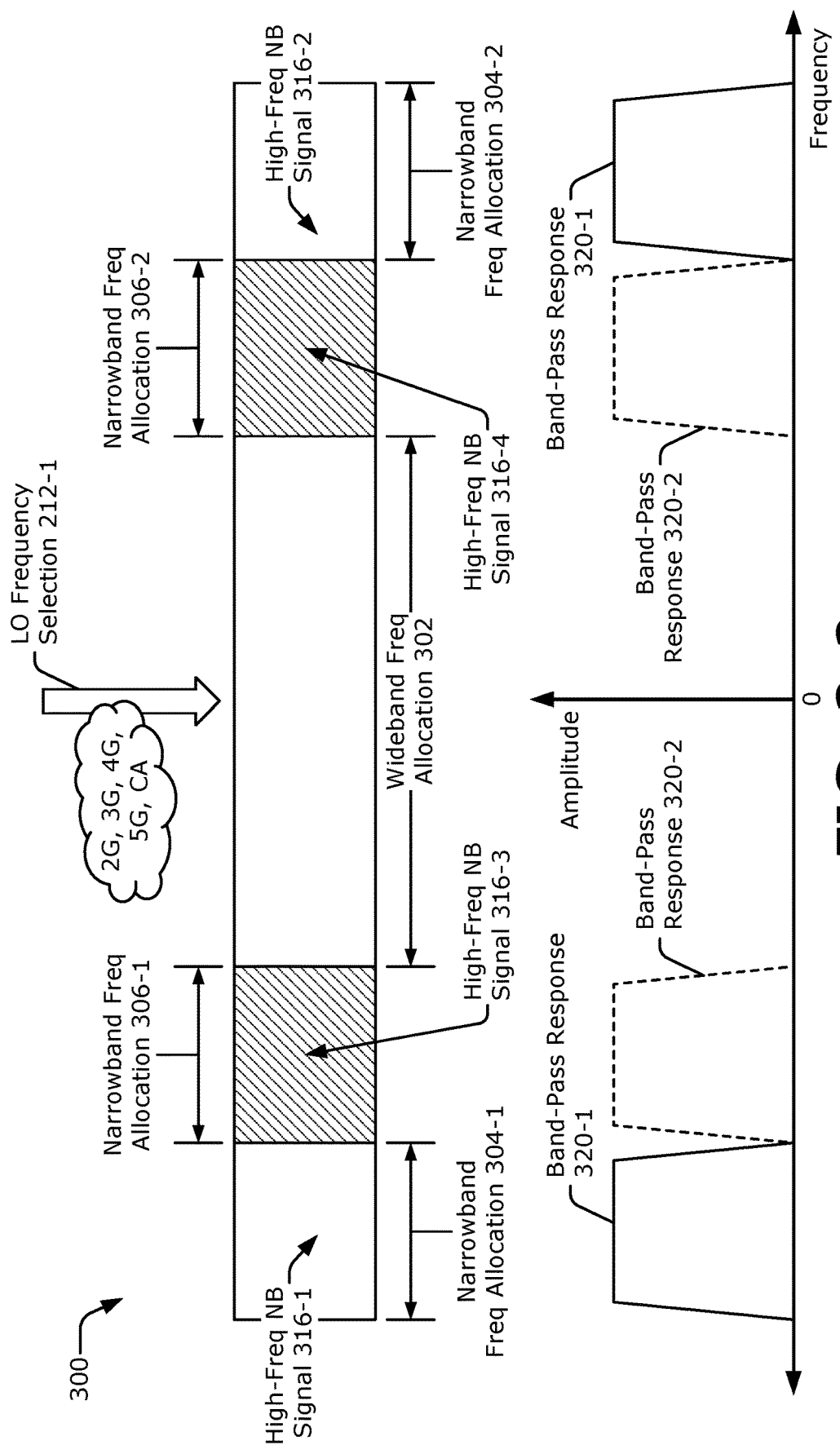
Figure 3:
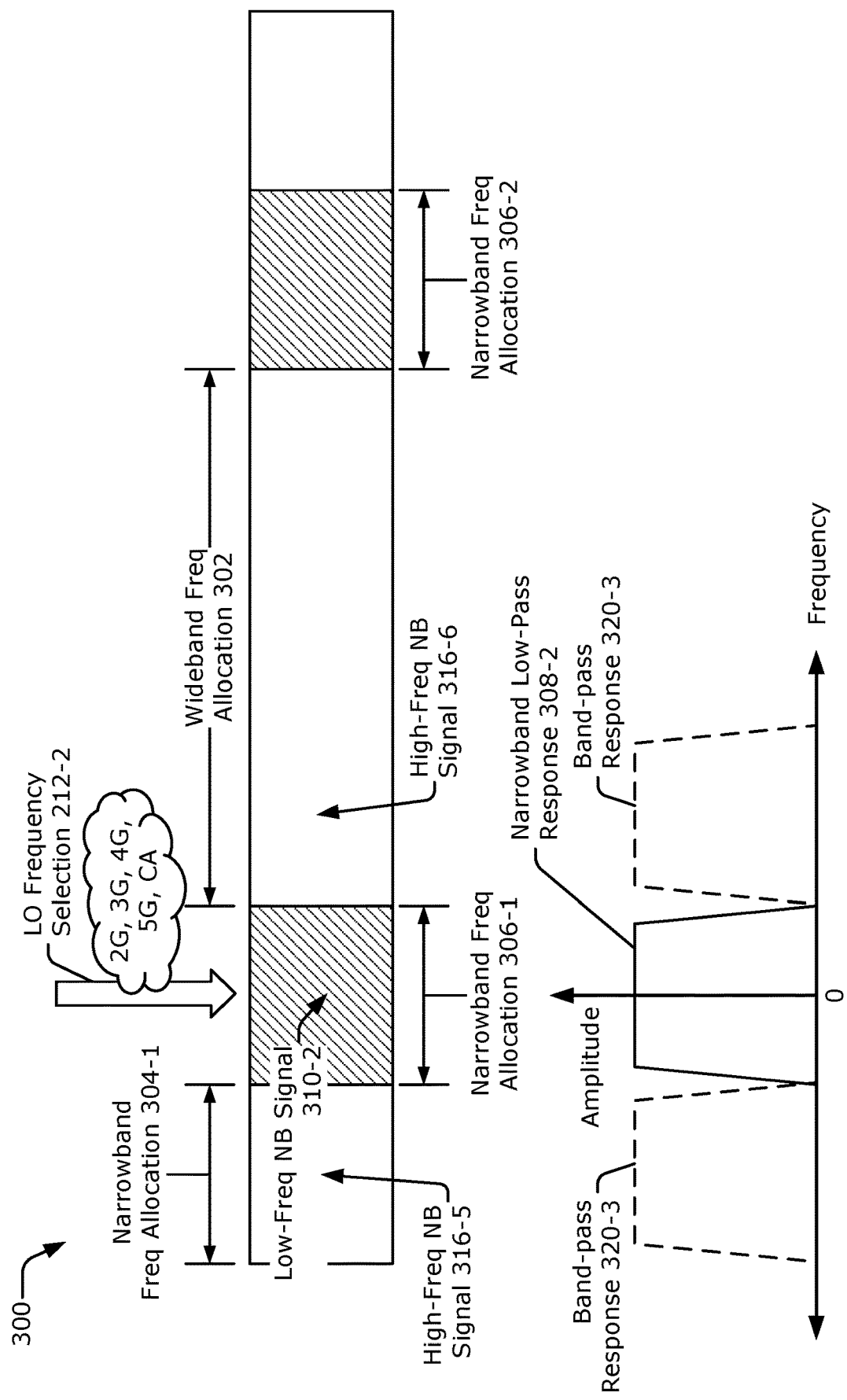

FIG. 3-1 illustrates example low-pass responses of the hybrid current-mode filter 124 for current-mode filtering using current steering. A portion of an example frequency spectrum allocation 300 is shown to include a wideband frequency allocation 302 and two narrowband frequency allocations 304-1 and 304-2, which are associated with a network provider. Disposed between the wideband frequency allocation 302 and the narrowband frequency allocations 304-1 and 304-2 are other narrowband frequency allocations 306-1 and 306-2, which are allocated to a different network provider (as indicated via the diagonal pattern). The frequencies associated with the frequency spectrum allocation 300 may be considered radio frequencies or intermediate frequencies based on the type of frequency stage that occurs within the receiver 200 prior to downconverting to baseband.

Using the local oscillator frequency selection 212 in FIG. 2, the processor 122 adjusts the local oscillator frequency to set a zero intermediate frequency (e.g., a DC frequency or a baseband frequency). To utilize the wideband frequency allocation 302, for example, a local oscillator frequency selection 212-1 is chosen to cause the local oscillator frequency to be near a center of the wideband frequency allocation 302. This sets the zero intermediate frequency to be relative to the center of the narrowband frequency allocation 304-1.

Within the baseband domain, different signals may be characterized with respect to the zero intermediate frequency. A low-frequency signal, for example, has a center frequency near the zero intermediate frequency while a high-frequency signal has a center frequency that is offset relative to the zero intermediate frequency (e.g., offset by approximately several MHz or more). Different types of low-frequency and high-frequency signals are shown in FIGS. 3-1, 3-2, and 3-3. For visual clarity, a center frequency and a bandwidth for each of these signals are not explicitly shown. Instead an arrow points to a particular frequency allocation that the center frequency and bandwidth of the signal is associated with. In other words, the signal includes frequencies that are within at least a portion of the frequency allocation identified by the arrow. In general, each frequency allocation includes one or more narrowband channels, wideband channels, or a combination thereof. The signals shown in FIGS. 3-1, 3-2, and 3-3 may be respectively assigned to particular channels within the frequency allocation.

Along with the local oscillator frequency selection 212-1, the processor 122 can cause the hybrid current-mode filter 124 to have a low-pass filter response via the filter configuration signal 218. With the low-pass response, the hybrid current-mode filter 124 can pass at least one low-frequency signal via the narrowband low-pass filter 128, at least one high-frequency signal via the wideband low-pass filter 126, or both a low-frequency signal and a high-frequency signal via the wideband low-pass filter 126. Different low-pass responses may be realized by tuning or adjusting a cut-off frequency of the wideband low-pass filter 126 or the narrowband low-pass filter 128. In general, a bandwidth of the low-pass response is designed to encompass one or more signals and may be on the order of hundreds of kilohertz or a few gigahertz (e.g., between approximately 100 kHz and 4 GHz). In some cases, the bandwidth of the low-pass response encompasses multiple channels within a particular frequency allocation such that the hybrid current-mode filter 124 can pass different signals that are assigned to different channels.

For example, the hybrid current-mode filter 124 may be configured to have a narrowband low-pass response 308-1 to pass a low-frequency narrowband (NB) signal 310-1 having a center frequency near the local oscillator frequency selection 212-1. As another example, the hybrid current-mode filter 124 may be configured to have a wideband low-pass response 312-1 to encompass a larger portion of the wideband frequency allocation 302 and pass a low-frequency wideband (WB) signal 314 having a center frequency near the local oscillator frequency selection 212-1. The wideband low-pass response 312-1 also enables the hybrid current-mode filter to pass multiple narrowband signals that may be within the wideband frequency allocation 302.

To pass multiple non-contiguous signals that are within the narrowband frequency allocation 304-1 (e.g., a high-frequency narrowband signal 316-1), within the wideband frequency allocation 302 (e.g., the low-frequency narrowband signal 310-1 or the low-frequency wideband signal 314), or within the narrowband frequency allocation 304-2 (e.g., a high-frequency narrowband signal 316-2), the hybrid current-mode filter 124 is configured to have a wideband low-pass response 312-2, with a bandwidth that encompasses these different frequency allocations. In this case, the hybrid current-mode filter 124 may also pass signals that are within the narrowband frequency allocations 306-1 and 306-2. If these narrowband frequency allocations 306-1 and 306-2 include high-power jammers, the hybrid current-mode filter 124 may be configured to have a band-pass response instead, as described in further detail with respect to FIG. 3-2.

FIG. 3-2 illustrates example band-pass responses of the hybrid current-mode filter 124 for current-mode filtering using current steering. Similar to FIG. 3-1, the local oscillator frequency selection 212-1 sets the zero intermediate frequency to be relative to a center of the wideband frequency allocation 302. Along with providing the local oscillator frequency selection 212-1, the processor 122 can cause the hybrid current-mode filter 124 to have a band-pass response via the filter configuration signal 218. With the band-pass response, the hybrid current-mode filter 124 can pass at least one high-frequency signal via the wideband low-pass filter 126 and pass at least one jammer via the narrowband low-pass filter 128. In this way, the jammer is attenuated with respect to the wideband path. In general, different band-pass responses 320-1 or 320-2 may be realized by tuning or adjusting respective cut-off frequencies of the wideband low-pass filter 126 or the narrowband low-pass filter 128. A bandwidth of the band-pass response 320-1 or 320-2 may be on the order of hundreds of kilohertz (kHz) (e.g., between approximately 100 kHz and 1 GHz). Similar to the low-pass response, the bandwidth of the band-pass response 320-1 or 320-2 can encompass multiple channels within a particular frequency allocation such that the hybrid current-mode filter 124 can pass different signals that are assigned to different channels.

The hybrid current-mode filter 124 may be configured to have a band-pass response 320-1 along the wideband path to pass one or more of the high-frequency narrowband signals 316-1 or 316-2 and attenuate one or more jammer signals that are within the narrowband frequency allocations 306-1 and 306-2. Alternatively, the hybrid current-mode filter 124 may be configured to have a band-pass response 320-2 along the wideband path to pass one or more of the high-frequency narrowband signals 316-3 or 316-4 that are within the narrowband frequency allocations 306-1 and 306-2 and attenuate one or more jammer signals that are within the wideband frequency allocation 302. As such, the hybrid current-mode filter 124 can readily support different frequency allocations of different network providers. By passing the high-frequency narrowband signals 316-1 and 316-2 or the high-frequency narrowband signals 316-3 and 316-4, data rates may be increased using non-contiguous carrier aggregation (NCCA). In some implementations, the local oscillator frequency selection 212 of FIG. 2 can be dynamically adjusted by the processor 122 to set the zero intermediate frequency relative to another frequency, as shown in FIG. 3-3.

FIG. 3-3 illustrates other example responses of the hybrid current-mode filter 124 for current-mode filtering with switching. In this case, the processor 122 provides a local oscillator frequency selection 212-2, which sets the zero intermediate frequency relative to a center of the narrowband frequency allocation 306-1. Along with the local oscillator frequency selection 212-2, the processor 122 can cause the hybrid current-mode filter 124 to have a narrowband low-pass response 308-2 along the narrowband path to pass a low-frequency narrowband signal 310-2. To pass one or more high-frequency narrowband signals 316-5 or 316-6, the hybrid current-mode filter 124 may be configured to have the band-pass response 320-3 along the wideband path. This enables the hybrid current-mode filter 124 to pass non-contiguous signals that are respectively within the narrowband frequency allocation 304-1 and the wideband frequency allocation 302, and to attenuate other signals or jammers that may be within the narrowband frequency allocation 306-1. In general, different local oscillator frequency selections 212 and filter configuration signals 218 enable efficient use of available portions of the frequency spectrum allocation 300. As shown in FIGS. 3-1, 3-2, and 3-3, the different responses of the hybrid current-mode filter 124 with respect to the wideband path or the narrowband path can be real and symmetrical about the zero intermediate frequency. An example implementation of the hybrid current-mode filter 124 is further described with respect to FIG. 4.

Figure 4:
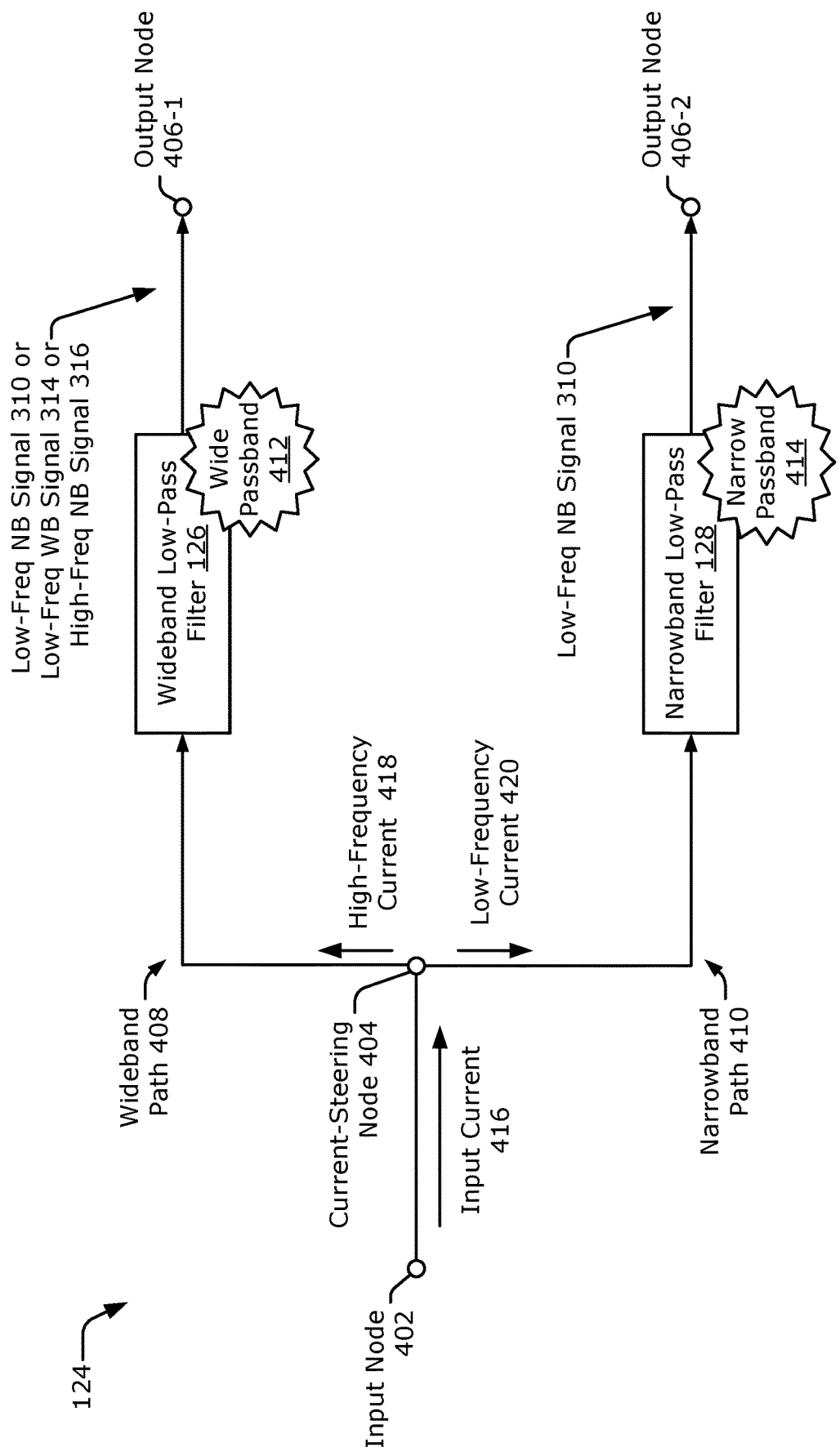
FIG. 4 illustrates an example hybrid current-mode filter for current-mode filtering using current steering.

FIG. 4 illustrates an example hybrid current-mode filter 124 for current-mode filtering using current steering. In the depicted configuration, the hybrid current-mode filter 124 includes an input node 402, a current-steering node 404, output nodes 406-1 and 406-2, a wideband path 408, and a narrowband path 410. The wideband path 408 is coupled between the current-steering node 404 and the output node 406-1, and includes the wideband low-pass filter 126. The narrowband path 410 is coupled between the current-steering node 404 and the output node 406-2, and includes the narrowband low-pass filter 128. The input node 402 can be coupled to a mixer, such as the mixers 204-1 or 204-2 of FIG. 2. The output nodes 406-1 and 406-2 can be coupled to one or more analog-to-digital converters, such as the analog-to-digital converters 206-1, 206-2, 206-3, or 206-4 of FIG. 2.

The wideband low-pass filter 126 and the narrowband low-pass filter 128 have a wide passband 412 and a narrow passband 414, respectively. In general, the wide passband 412 is significantly larger than the narrow passband 414. For example, the narrow passband 414 may be on the order of hundreds of kilohertz (kHz) to tens of megahertz (MHz) (e.g., between approximately 100 kHz and 100 MHz or less than approximately 100 MHz) while the wide passband 412 may be on the order of hundreds of megahertz (MHz) or a few gigahertz (GHz) (e.g., greater than approximately 100 MHz or between approximately 400 MHz and 4 GHz).

The wideband low-pass filter 126 and the narrowband low-pass filter 128 also have different impedances. The narrowband low-pass filter 128, for example, has a lower impedance than the wideband low-pass filter 126 within the narrow passband 414. The narrowband low-pass filter 128 and the wideband low-pass filter 126 impedances may differ by a factor of 100 or more within the narrow passband 414. For example, the impedances of the narrowband low-pass filter 128 and the wideband low-pass filter 126 may be approximately 0.5 ohms and 50 ohms, respectively, within the narrow passband 414. The wideband low-pass filter 126, however, has a lower impedance than the narrowband low-pass filter 128 for frequencies that are outside the narrow passband 414 and within the wide passband 412. These impedance differences enable current steering to influence a response of the hybrid current-mode filter 124.

At the input node 402 the hybrid current-mode filter 124 accepts an input current 416, which may correspond to the in-phase current 214 or the quadrature current 216 of FIG. 2. In this example, the input current 416 comprises a high-frequency current 418 associated with at least one of the high-frequency narrowband signals 316 of FIGS. 3-1, 3-2, and 3-3. The high-frequency narrowband signal 316 has frequencies that are outside of the narrow passband 414 and within the wide passband 412. The input current 416 may also include a low-frequency current 420 associated with a low-frequency narrowband signal 310-1 or 310-2, or a jammer that has frequencies lower than a frequency of the high-frequency narrowband signal 316. The low-frequency narrowband signal 310 or the jammer have frequencies that are inside the narrow passband 414.

At the current-steering node 404, the high-frequency current 418 and the low-frequency current 420 are steered towards the path having a smaller impedance for the frequency of the current (e.g., the wideband path 408 or the narrowband path 410). Because the wideband low-pass filter 126 has a smaller impedance at frequencies corresponding to the high-frequency current 418, the high-frequency current 418 is steered via the wideband path 408 towards the wideband low-pass filter 126. The narrowband low-pass filter 128, however, has a smaller impedance at frequencies corresponding to the low-frequency current 420. Therefore the low-frequency current 420 is steered via the narrowband path 410 towards the narrowband low-pass filter 128.

The wideband low-pass filter 126 passes at least one high-frequency narrowband signal 316 to the output node 406-1 and the narrowband low-pass filter 128 passes the low-frequency narrowband signal 310 or the jammer to the output node 406-2. In some cases, these narrowband signals 310 or 316 may be contiguous or non-contiguous signals within the wideband frequency allocation 302 or the narrowband frequency allocation 304-1 or 304-2 (as shown in FIGS. 3-1 and 3-3). The wideband low-pass filter 126 and the narrowband low-pass filter 128 can further adjust respective amplitudes of the narrowband signals 310 or 316 to make them relatively similar (e.g., within approximately one decibel or less). This improves a signal-to-noise ratio for performing carrier aggregation. In general, the current steering provides an inherent or natural selection that enables multiple signals to be passed via the wideband path 408 or the narrowband path 410.

Current steering may also be used to separate the jammer from a high-frequency narrowband signals 316. The jammer, for example, may represent a signal used by another network provider. By steering the jammer to the narrowband path 410, the jammer is attenuated along the wideband path 408, which prevents it from interfering with the high-frequency narrowband signal 316 or desensitizing the receiver 200. In this case, an analog-to-digital converter 206 that is coupled to the output node 406-2 may be disabled or placed in an inactive state to avoid processing the jammer.

For 2G, 3G, or 4G modes without carrier aggregation, the narrowband path 410 steers the low-frequency narrowband signal 310-1 or 310-2 towards the narrowband low-pass filter 128, which passes the low-frequency narrowband signal 310-1 or 310-2 to the output node 406-2. In this case, the wideband path 408 can steer other higher frequency jammers away from the narrowband path 410 and towards the wideband low-pass filter 126. In this way, the other jammers are attenuated at the output node 406-2. An analog-to-digital converter 206 that is coupled to the output node 406-1 may be disabled or placed in an inactive state to avoid processing the other jammers.

Figures 1, 7:
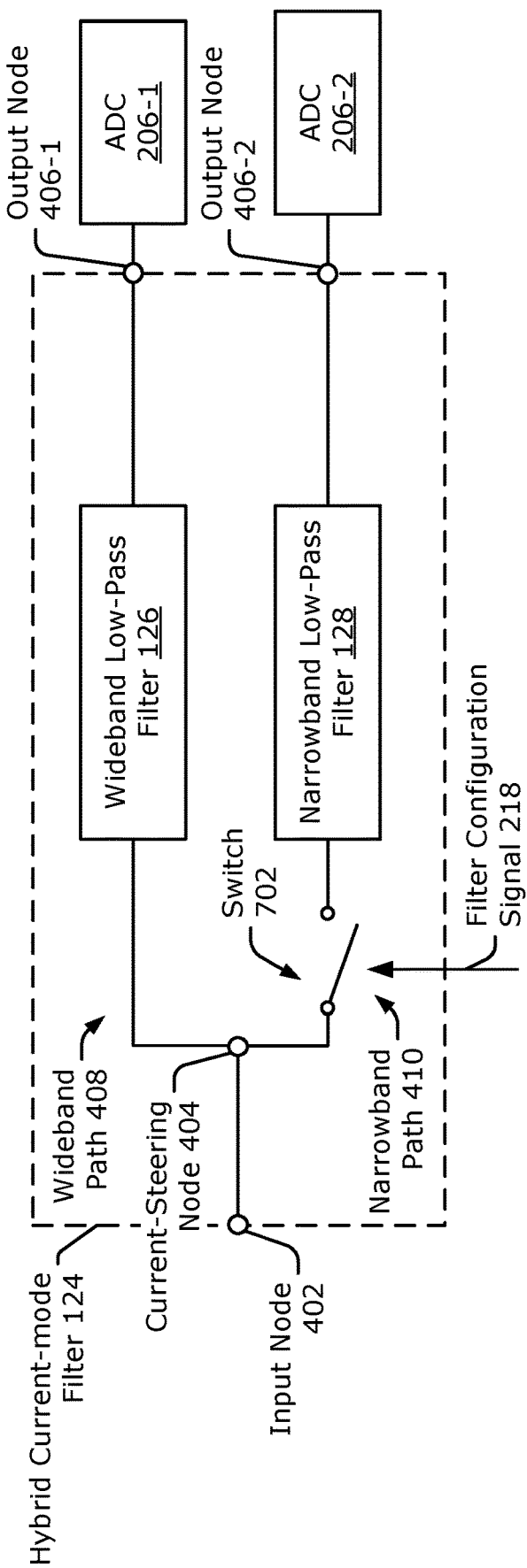
Figures 2, 7:
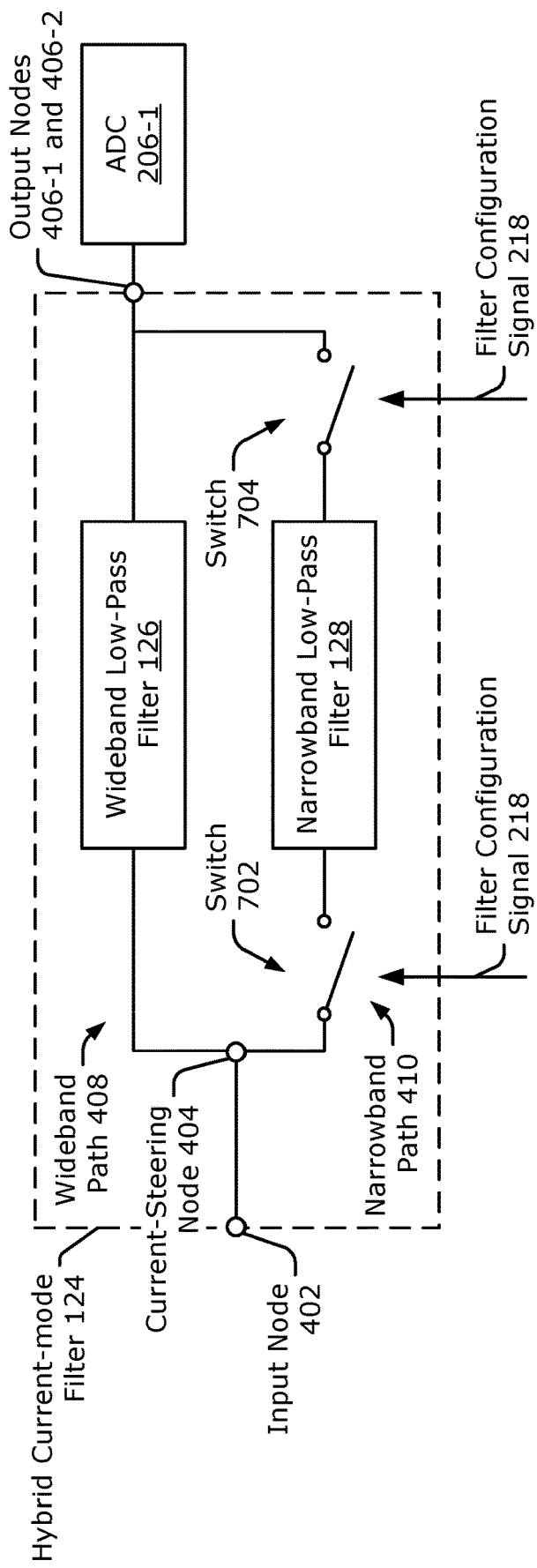

In some implementations, such as those shown in FIGS. 7-1 and 7-2, the narrowband path 410 may be disconnected from the current-steering node 404 using a switch. If the narrowband path 410 is disconnected, the low-frequency narrowband signal 310-1 or 310-2, the low-frequency wideband signal 314, or the high-frequency narrowband signal 316 are steered via the wideband path 408 towards the wideband low-pass filter 126. The wideband low-pass filter 126 passes these signals to the output node 406-1. Various frequency responses of the hybrid current-mode filter 124 that result due to the current steering are further described with respect to FIG. 5.

Figure 5:
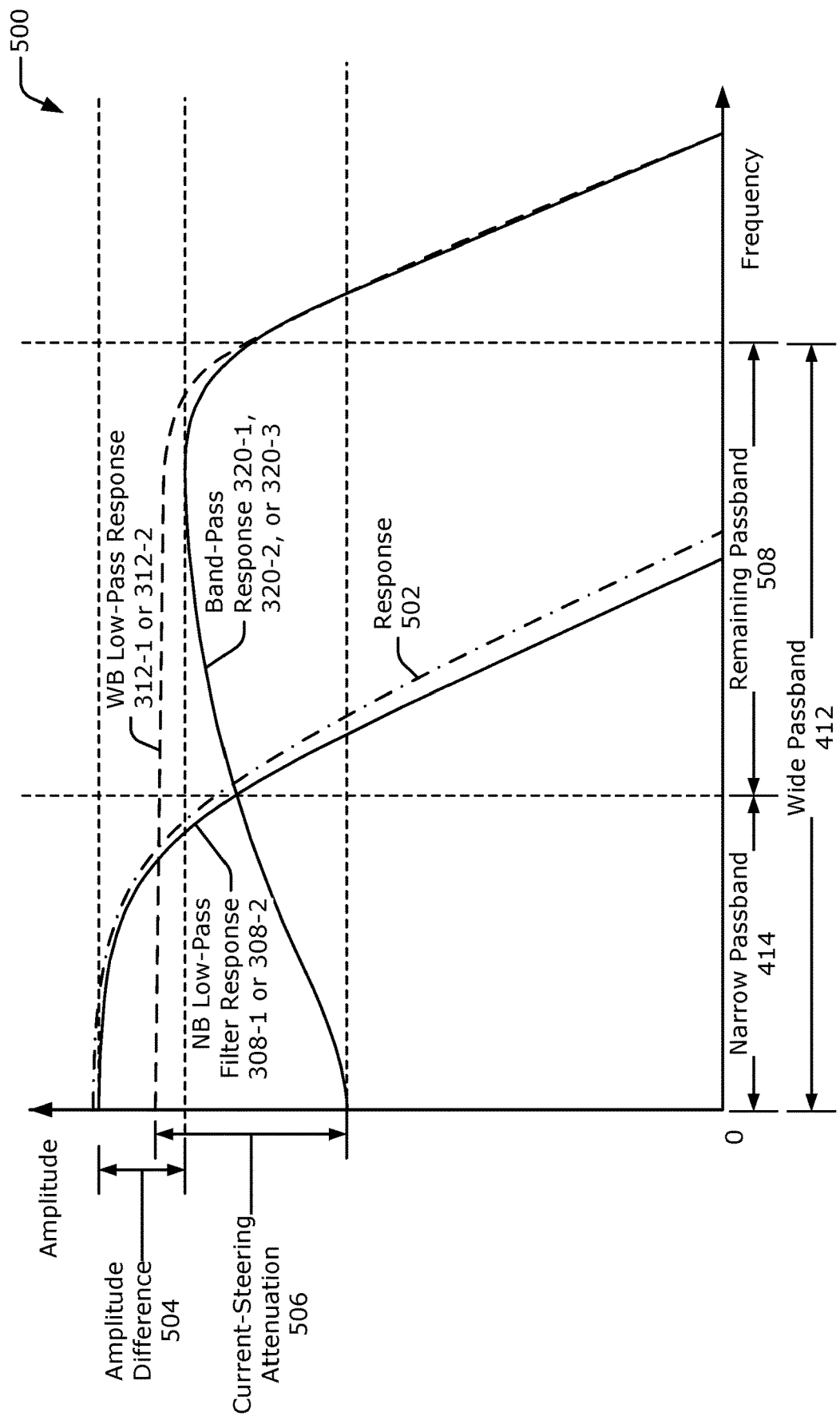
FIG. 5 illustrates example frequency responses of a hybrid current-mode filter for current-mode filtering using current steering.

FIG. 5 illustrates example frequency responses of the hybrid current-mode filter 124 for current-mode filtering using current steering. In a graph 500, multiple frequency responses are plotted for the various configurations of the hybrid current-mode filter 124, which may be controlled via the filter configuration signal 218. To describe the various frequency responses, first consider respective responses of the wideband low-pass filter 126 and the narrowband low-pass filter 128 separately. In the graph 500, the responses are shown relative to the zero intermediate frequency (e.g., DC frequency or 0 Hz). Although not explicitly shown, the responses may be considered to be reflected or folded about the 0 Hz axis to encompass negative frequencies, as shown in FIGS. 3-1, 3-2, and 3-3. As shown in FIG. 5, the wide passband 412 encompasses the narrow passband 414. A portion of the wide passband 412 that is outside of the narrow passband 414 is identified as a remaining passband 508.

If the narrowband path 410 is disconnected from the current-steering node 404, the input current 416 is steered towards the wideband path 408. As shown by the wideband low-pass response 312-1 or 312-2, the wideband low-pass filter 126 passes frequencies within the wide passband 412 and attenuates frequencies outside the wide passband 412. In contrast, if the wideband path 408 is disconnected from the current-steering node 404, the input current 416 is steered towards the narrowband path 410. As shown by a response 502, the narrowband low-pass filter 128 passes frequencies within the narrow passband 414 and attenuates frequencies outside of the narrow passband 414.

If both the wideband path 408 and the narrowband path 410 are connected to the current-steering node 404, a response of the hybrid current-mode filter 124 relative to the output nodes 406-1 and 406-2 are respectively shown via narrowband low-pass response 308-1 or 308-2 and band-pass response 320-1, 320-2, or 320-3. Due to current steering, an amplitude of the band-pass response 320-1, 320-2, or 320-3 is lower than an amplitude of the wideband low-pass response 312-1 or 312-2 within the narrow passband 414. This is because frequencies within the narrow passband 414 are steered towards the narrowband path 410 instead of the wideband path 408. The current steering causes the frequencies within the narrow passband 414 to be attenuated at the output node 406-1, as shown by the current-steering attenuation 506. The amount of attenuation may be on the order of tens of decibels (dB), such as between approximately 10 and 30 dB. Consequently, the response of the wideband path 408 is similar to a bandpass filter as frequencies that are within the remaining passband 508 are passed to the output node 406-1. Along the narrowband path 410, the narrowband low-pass response 308-1 or 308-2 remains relatively similar to the response 502. Therefore, the current steering does not significantly change the response through the narrowband path 410.

An amplitude difference 504 between the narrowband low-pass response 308 and the band-pass response 320 can be adjusted to equalize the amplitudes of the signals that are passed. If the low-frequency narrowband signal 310, for example, is weaker than the high-frequency narrowband signal 316, the narrowband low-pass response 308 through the narrowband path 410 can be changed via the filter configuration signal 218 to increase an amplitude of the low-frequency narrowband signal 310. Similarly, the band-pass response 320 can be changed to increase the amplitudes of the high-frequency narrowband signals 316 if these signals are weaker relative to the low-frequency narrowband signal 310. Example implementations of the wideband low-pass filter 126 and the narrowband low-pass filter 128 are further described with respect to FIG. 6.

Figure 6:
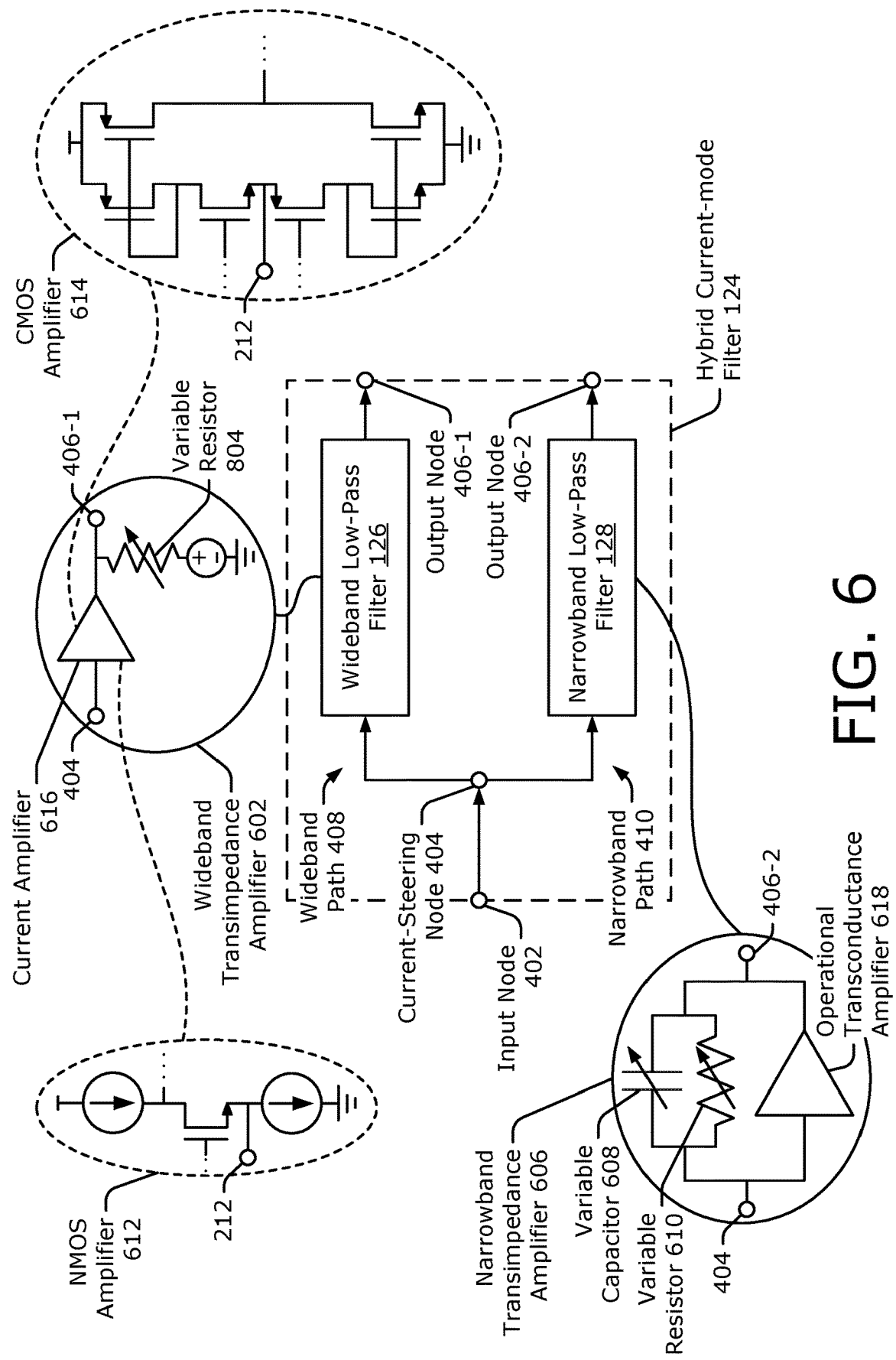
FIG. 6 illustrates example implementations of a wideband low-pass filter and narrowband low-pass filter for current-mode filtering using current steering.

FIG. 6 illustrates example implementations of the wideband low-pass filter 126 and the narrowband low-pass filter 128 for current-mode filtering using current steering. In the depicted configuration, the wideband low-pass filter 126 includes a wideband transimpedance amplifier 602, which may be implemented using a current amplifier 616 and a variable resistor 604. The wideband transimpedance amplifier 602 is connected in series along the wideband path 408 and the variable resistor 604 is connected in shunt between the wideband path 408 and a bias node (e.g., a voltage source). The wideband transimpedance amplifier 602 can be implemented using at least one transistor and can comprise a current-mode transconductor-capacitor transimpedance amplifier (gm-C TIA).

Example implementations of the current amplifier 616 include an N-channel metal-oxide semiconductor (NMOS) amplifier 612 or a complementary metal-oxide semiconductor (CMOS) amplifier 614, which are respectively shown towards the left and right of FIG. 6. Although the NMOS amplifier 612 uses fewer components and is small relative to the CMOS amplifier 614, the CMOS amplifier 614 can be used to further adjust a gain of the wideband path 408 via the current ratio. A resistance of the variable resistor 604 can also be changed via the filter configuration signal 218 to adjust the gain of the wideband path 408. In this way, the amplitude of the wideband low-pass response 312 or the band-pass response 320 can be shifted up or down in FIG. 5 to improve the signal-to-noise ratio. In general, the wideband low-pass filter 126 is implemented using an open-loop filter architecture to achieve the wide passband 412. Although single-ended circuits are shown in FIG. 6, other implementations may comprise differential circuits to reject common-mode noise and disturbances.

The narrowband low-pass filter 128 can be implemented using a narrowband transimpedance amplifier 606. In the depicted configuration, the narrowband transimpedance amplifier 606 includes an operational transconductance amplifier (OTA) 618, a variable capacitor 608, and a variable resistor 610, which are coupled together in parallel between the current-steering node 404 and the output node 406-2. Values of the variable resistor 610 and the variable capacitor 608 can also be set based on the filter configuration signal 218 to adjust a gain of the narrowband path 410 and adjust a width or cut-off frequency of the narrowband low-pass response 308.

Because the hybrid current-mode filter 124's response is tunable, the hybrid current-mode filter 124 can support frequency allocations for different network providers, different continents, and for different frequency bands. Example characteristics of the filter response that can be tuned include a cut-off frequency, rolloff, bandwidth, or quality factor. This customization, for example, enables the response of the hybrid current-mode filter 124 to be appropriately adjusted based on bandwidths of the low-frequency wideband signal 314, the low-frequency narrowband signal 310, or the high-frequency narrowband signals 316, or based on a separation of the high-frequency narrowband signals 316. Using the wideband low-pass filter 126 and the narrowband low-pass filter 128, other implementations of the hybrid current-mode filter 124 may also be implemented, as shown in FIGS. 7-1, 7-2, 8-1, and 8-2.

FIG. 7-1 illustrates an example hybrid current-mode filter 124 including a switch for current-mode filtering using current steering. In the depicted configuration, the hybrid current-mode filter 124 includes a switch 702, which is coupled between the current-steering node 404 and the narrowband low-pass filter 128. An open or close state of the switch 702 can be controlled by the processor 122 (not shown) via the filter configuration signal 218.

The switch 702 connects or disconnects the narrowband path 410 to or from the current-steering node 404. If the switch 702 is open, the narrowband path 410 is disconnected, which causes both the low-frequency current 420 and the high-frequency current 418 of FIG. 4 to be steered towards the wideband low-pass filter 126 via the wideband path 408 and the hybrid current-mode filter 124 to have the wideband low-pass response 312-1 or 312-2 of FIG. 3-1 or 5. This configuration can be used to pass a variety of different signals to the output node 406-1 via the wideband low-pass filter 126. For example, a low-frequency wideband signal 314 may be passed for 5G wireless communications or multiple narrowband signals 310 or 316 (e.g., contiguous or non-contiguous) may be passed for carrier aggregation. As shown in FIG. 7-1, the output nodes 406-1 and 406-2 are respectively coupled to the analog-to-digital converters 206-1 and 206-2. In some cases, a single analog-to-digital converter may be coupled to the hybrid current-mode filter 124, as shown in FIG. 7-2.

FIG. 7-2 illustrates an example hybrid current-mode filter 124 including two switches for current-mode filtering using current steering. In the depicted configuration, the output nodes 406-1 and 406-2 are coupled together to the analog-to-digital converter 206-1. The narrowband path 410 also includes a switch 704, which is coupled between the narrowband low-pass filter 128 and the output nodes 406-1 and 406-2. If the switches 702 and 704 are in an open state, the wideband path 408 can pass the low-frequency wideband signal 314 to the analog-to-digital converter 206-1. Alternatively if the switches 702 and 704 are in a closed state, the narrowband path 410 can pass a low-frequency narrowband signal 310 to the analog-to-digital converter 206-1. In this way, a single analog-to-digital converter may be used to digitize wideband or narrowband signals. This can save space and reduce cost of the wireless transceiver 120. Other implementations of the hybrid current-mode filter 124 are further described in FIGS. 8-1 and 8-2.

Figures 1, 8:
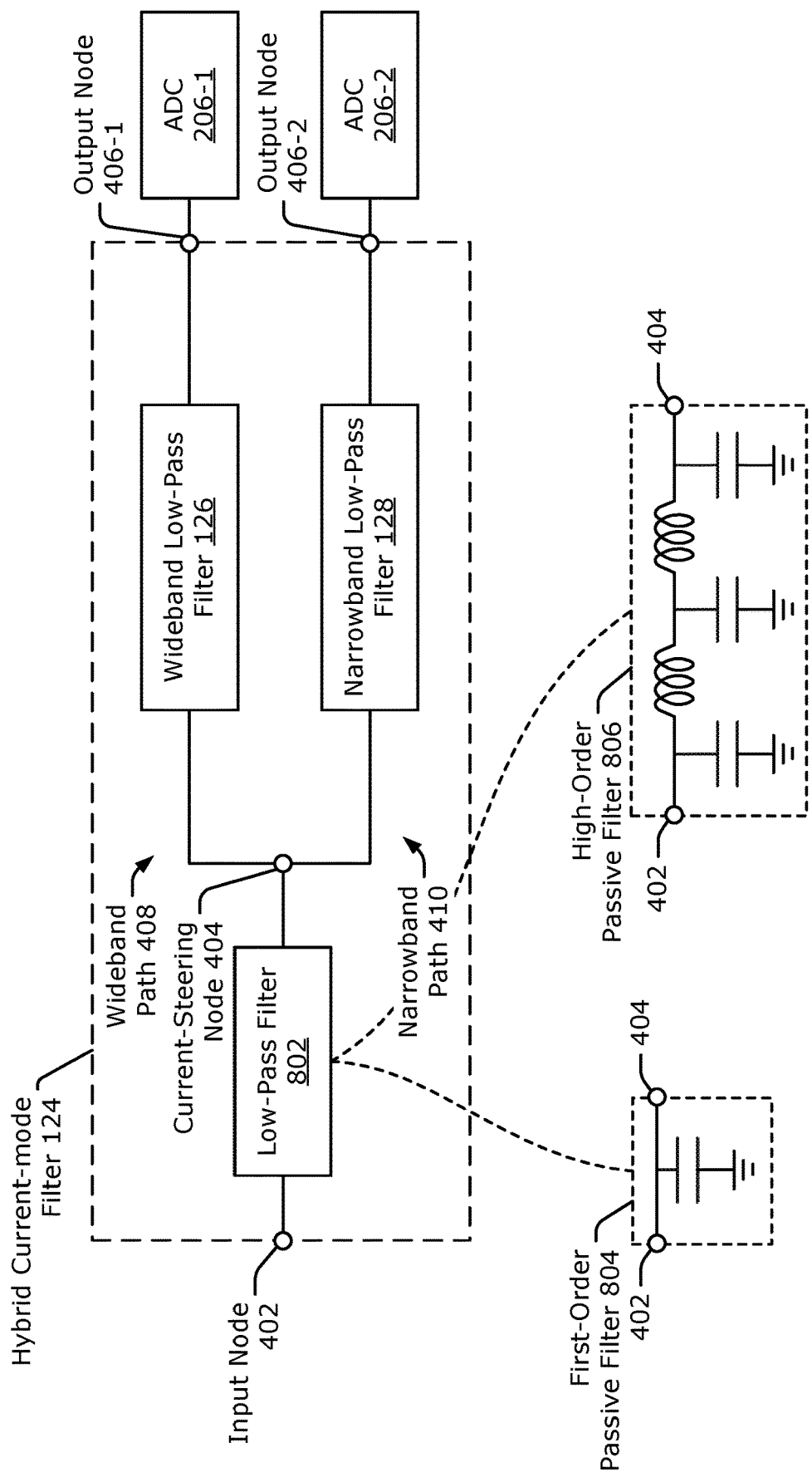
Figures 2, 8:
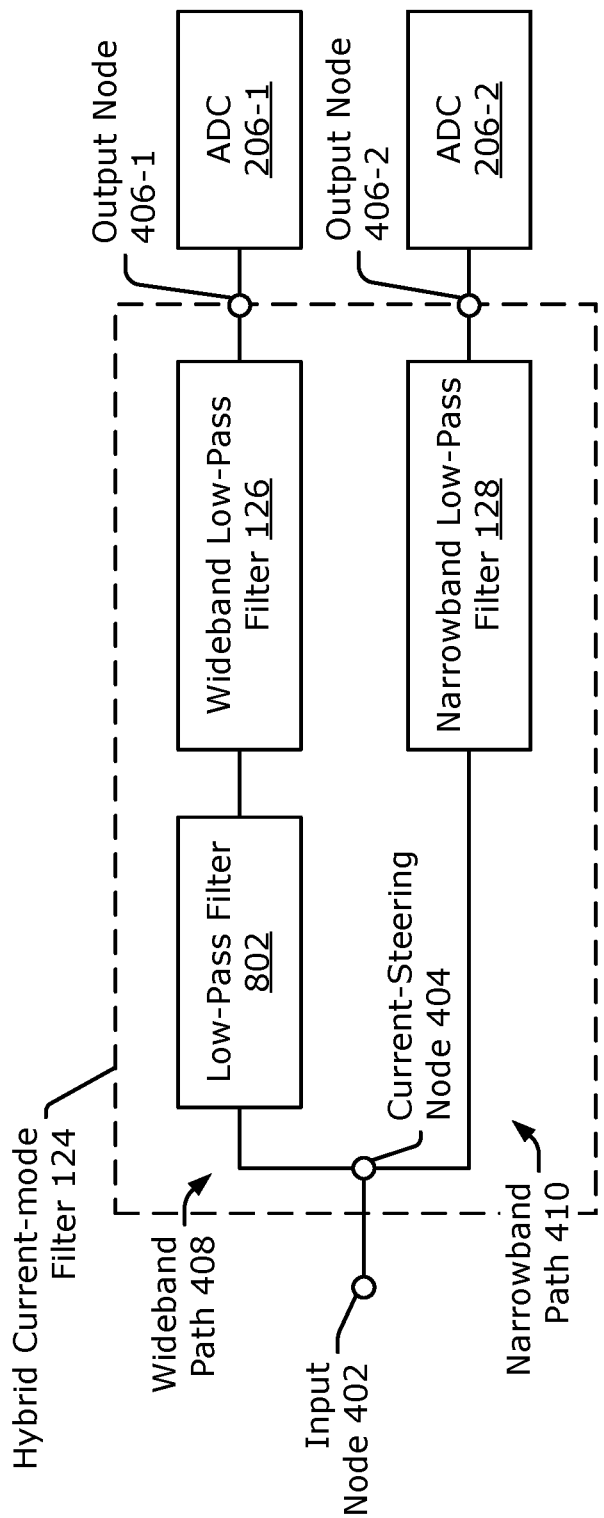

FIG. 8-1 illustrates an example hybrid current-mode filter 124 including a low-pass filter 802 for current-mode filtering using current steering. In the depicted configuration, the low-pass filter 802 is coupled between the input node 402 and the current-steering node 404. The low-pass filter 802 can be implemented using a first-order passive filter 804 or a high-order passive filter 806. The first-order passive filter 804 includes a capacitor, which is coupled in shunt between the input node 402 and a ground. The high-order passive filter 806 includes multiple inductors and multiple capacitors. The multiple inductors are coupled in series along a path between the input node 402 and the current-steering node 404. The multiple capacitors are coupled in shunt between the path and the ground.

The low-pass filter 802 increases respective slopes of the narrowband low-pass response 308, the wideband low-pass response 312, or the band-pass response 320, shown in FIG. 5. Although not explicitly shown, the capacitors or inductors within the low-pass filter 802 may be adjustable, such that the responses 308, 312, and 320 can be tuned. While the high-order passive filter 806 provides steeper slopes relative to the first-order passive filter 804, the high-order passive filter 806 may consume additional area. To conserve space, the one or more capacitors within the high-order passive filter 806, the transimpedance amplifiers 602 and 606, and any other passive components can be stacked underneath the one or more inductors within the high-order passive filter 806. In some cases, the low-pass response 308 of the narrowband path 410 may achieve a target slope without the use of the low-pass filter 802. Accordingly, the low-pass filter 802 may be included within the wideband path 408, as described in further detail with respect to FIG. 8-2.

FIG. 8-2 illustrates another example hybrid current-mode filter 124 including the low-pass filter 802 for current-mode filtering using current steering. In the depicted configuration, the wideband path 408 includes the low-pass filter 802, which is coupled between the current-steering node 404 and the wideband low-pass filter 126. In this way, a design of the low-pass filter 802 can be specifically tuned for the wideband path 408 to set a slope of the wideband low-pass response 312 or the band-pass response 320. Because the low-pass filter 802 is implemented within the wideband path 408, the narrowband low-pass response 308 through the narrowband path 410 remains relatively unchanged. In general, any combination of the example implementations of the hybrid current-mode filter 124 that are described in FIGS. 4, 7-1, 7-2, 8-1, and 8-2 may be implemented. For example, one implementation may include both the switch 702 and the low-pass filter 802. Another implementation may include two low-pass filters 802, one between the input node 402 and the current-steering node 404 as shown in FIG. 8-1 and another within the wideband path 408 between the current-steering node 404 and the wideband low-pass filter 126 as shown in FIG. 8-2.

Figure 9:
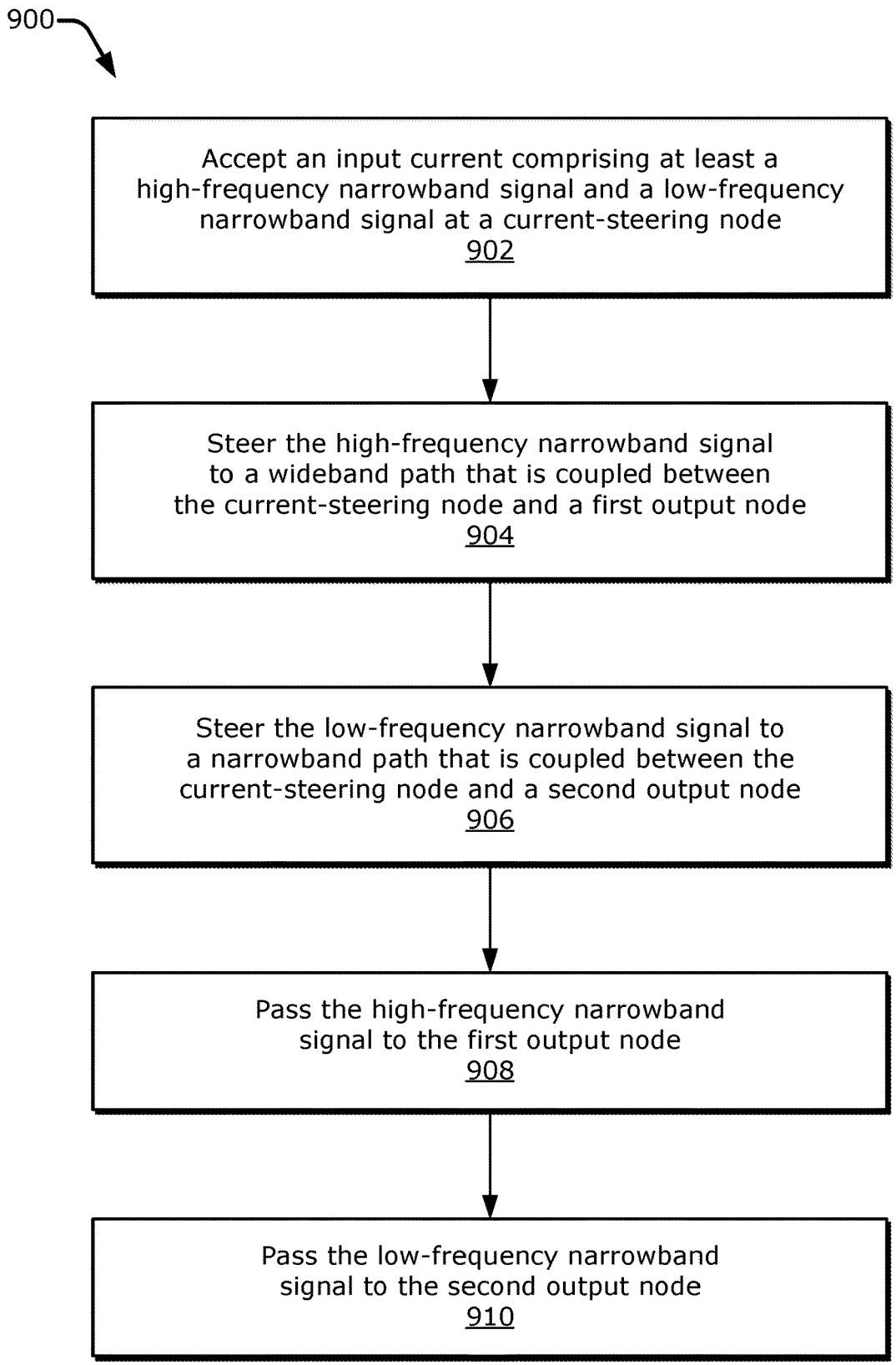
FIG. 9 is a flow diagram illustrating an example process for current-mode filtering using current steering.

FIG. 9 is a flow diagram illustrating an example process 900 for current-mode filtering using current steering. The process 900 is described in the form of a set of blocks 902-910 that specify operations that can be performed. However, operations are not necessarily limited to the order shown in FIG. 9 or described herein, for the operations may be implemented in alternative orders or in fully or partially overlapping manners. Operations represented by the illustrated blocks of the process 900 may be performed by a computing device 102 (e.g., of FIG. 1) or a wireless transceiver 120 (e.g., of FIG. 1 or 2). More specifically, the operations of the process 900 may be performed by a hybrid current-mode filter 124 as shown in FIG. 1, 2, 4, 7-1, 7-2, 8-1, or 8-2.

At block 902, an input current comprising at least a high-frequency narrowband signal and a low-frequency narrowband signal are accepted at a current-steering node. For example, the hybrid current-mode filter 124 accepts the input current 416 at the current-steering node 404. The input current 416 can include the high-frequency current 418, which is associated with at least one of the high-frequency narrowband signals 316, and the low-frequency current 420, which is associated with the low-frequency narrowband signal 310 or the jammer, as shown in FIGS. 3-1, 3-2, and 3-3. In some cases, the narrowband signals 310 and 316 may be contiguous or non-contiguous signals used for carrier aggregation. The input current 416 may comprise a differential input current that is provided via the mixer 204-1 or 204-2 of FIG. 2.

At block 904, the high-frequency narrowband signal is steered to a wideband path that is coupled between the current-steering node and a first output node. For example, impedance differences between the wideband path 408 and the narrowband path 410 cause the high-frequency current 418, which is associated with the high-frequency narrowband signal 316, to be steered to the wideband path 408 and away from the narrowband path 410.

At block 906, the low-frequency narrowband signal is steered to a narrowband path that is coupled between the current-steering node and a second output node. For example, the impedance differences between the narrowband path 410 and the wideband path 408 cause the low-frequency current 420, which is associated with the low-frequency narrowband signal 310, to be steered to the narrowband path 410 and away from the wideband path 408.

At block 908, the high-frequency narrowband signal is passed to the first output node. For example, the wideband low-pass filter 126 having the wide passband 412 passes the high-frequency narrowband signal 316 to the output node 406-1. The response of the hybrid current-mode filter 124 relative to the output node 406-1 is shown in FIGS. 3-1, 3-2, 3-3, and 5 by the band-pass response 320-1, 320-2, or 320-3.

At block 910, the low-frequency narrowband signal is passed to the second output node. For example, the narrowband low-pass filter 128 having the narrow passband 414 passes the low-frequency narrowband signal 310-1 or 310-2 to the output node 406-2. The response of the hybrid current-mode filter 124 relative to the output node 406-2 is shown in FIGS. 3-1, 3-3, and 5 by the narrowband low-pass response 308-1 or 308-2.

In the configuration described above, the hybrid current-mode filter 124 may be used to support 2G, 3G, 4G wireless communications or carrier aggregation. In other implementations, the narrowband path 410 may include the switch 702, which enables the hybrid current-mode filter 124 to also support 5G wireless communications. If the switch 702 is in an open state, the hybrid current-mode filter 124 passes the low-frequency wideband signal 314 or at least one narrowband signal 310 or 316. In this case, the response of the hybrid current-mode filter 124 relative to the output node 406-1 is shown in FIGS. 3-1, 3-3, and 5 by the wideband low-pass response 312-1 or 312-2. Because the hybrid current-mode filter 124 is capable of supporting a variety of different bandwidths, cost and size of the wireless transceiver 120 can be reduced.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a filter including:
    a current-steering node;
    a first output node and a second output node;
    a wideband path coupled between the current-steering node and the first output node, the wideband path including a wideband low-pass filter configured to pass frequencies within a wide passband, the wideband low-pass filter including a wideband transimpedance amplifier coupled in series along the wideband path between the current-steering node and the first output node; and
    a narrowband path coupled between the current-steering node and the second output node, the narrowband path including a narrowband low-pass filter configured to pass a portion of the frequencies that are within a narrow passband, the narrowband low-pass filter including a narrowband transimpedance amplifier coupled in series along the narrowband path between the current-steering node and the second output node.

2. The apparatus of claim 1, further comprising:
an input node; and
a low-pass filter coupled between the input node and the current-steering node, the low-pass filter comprising one or more passive components.

3. The apparatus of claim 1, wherein the wideband path includes a low-pass filter coupled between the current-steering node and the wideband low-pass filter.

4. The apparatus of claim 1, further comprising:
a low-noise amplifier;
a mixer coupled between the low-noise amplifier and the current-steering node;
a first analog-to-digital converter coupled to the first output node; and
a second analog-to-digital converter coupled to the second output node.

5. The apparatus of claim 1, wherein:
the narrowband low-pass filter is configured to have an impedance; and
the wideband low-pass filter is configured to have another impedance that is larger within the narrow passband and smaller within a portion of the wide passband that is outside of the narrow passband relative to the impedance of the narrowband low-pass filter.

6. The apparatus of claim 5, wherein:
the current-steering node is configured to accept an input current comprising a low-frequency current having frequencies within the narrow passband; and
the narrowband path is configured to steer the low-frequency current to the narrowband low-pass filter based on the impedance of the narrowband low-pass filter being smaller than the other impedance of the wideband low-pass filter within the narrow passband.

7. The apparatus of claim 6, wherein the input current comprises differential currents associated with an in-phase current or a quadrature current.

8. The apparatus of claim 6, wherein the low-frequency current is associated with at least one of the following:
a second-generation (2G) wireless signal;
a third-generation (3G) wireless signal; or
a fourth-generation (4G) wireless signal.

9. The apparatus of claim 6, wherein:
the input current comprises a high-frequency current having other frequencies that are within the wide passband and outside the narrow passband; and
the wideband path is configured to steer the high-frequency current from the current-steering node to the wideband low-pass filter based on the other impedance of the wideband low-pass filter being smaller than the impedance of the narrowband low-pass filter within the wide passband and outside the narrow passband.

10. The apparatus of claim 9, further comprising an analog-to-digital converter coupled to the second output node, wherein:
the low-frequency current is associated with a jammer;
the high-frequency current is associated with at least one high-frequency narrowband signal having a center frequency that is offset relative to another center frequency of the jammer; and
the analog-to-digital converter is configured to be in an inactive state to avoid processing the jammer.

11. The apparatus of claim 9, wherein:
the high-frequency current is associated with at least one high-frequency narrowband signal;
the low-frequency current is associated with a low-frequency narrowband signal;
the at least one high-frequency narrowband signal and the low-frequency narrowband signal comprise at least two non-contiguous signals; and
the wideband low-pass filter and the narrowband low-pass filter are together configured to cause amplitudes of the at least two non-contiguous signals to be relatively similar.

12. The apparatus of claim 9, wherein:
the high-frequency current is associated with at least one high-frequency narrowband signal;

the low-frequency current is associated with a low-frequency narrowband signal;
the at least one high-frequency signal and the low-frequency narrowband signal comprise at least two contiguous signals; and
the wideband low-pass filter and the narrowband low-pass filter are together configured to cause amplitudes of the at least two contiguous signals to be relatively similar.

13. The apparatus of claim 1, wherein the narrowband path includes a switch coupled between the current-steering node and the narrowband low-pass filter, the switch configured to connect or disconnect the narrowband path to or from the current-steering node.

14. The apparatus of claim 13, wherein:
the current-steering node is configured to accept an input current associated with a low-frequency wideband signal having the frequencies within the wide passband of the wideband low-pass filter; and
the wideband path is configured to steer the input current from the current-steering node to the wideband low-pass filter based on the switch disconnecting the narrowband path from the current-steering node.

15. The apparatus of claim 14, wherein the low-frequency wideband signal is associated with a fifth-generation (5G) wireless signal.

16. The apparatus of claim 13, wherein:
the second output node is coupled to the first output node; and
the narrowband path includes another switch coupled between the narrowband low-pass filter and the first output node.

17. The apparatus of claim 16, wherein:
the wideband path is configured to provide a low-frequency wideband signal at the first output node based on both the switch and the other switch being in an open state; and
the narrowband path is configured to provide a low-frequency narrowband signal at the first output node based on both the switch and the other switch being in a closed state.

18. An apparatus comprising:
a filter including:
a current-steering node configured to accept an input current comprising at least a high-frequency narrowband signal a low-frequency narrowband signal, and a low-frequency wideband signal;
a first output node and a second output node;
a wideband path coupled between the current-steering node and the first output node, the wideband path including wideband filter means for passing the high-frequency narrowband signal to the first output node;
a narrowband path coupled between the current-steering node and the second output node, the narrowband path including narrowband filter means for passing the low-frequency narrowband signal to the second output node; and
impedance means for steering the high-frequency narrowband signal and the low-frequency narrowband signal to the wideband path and the narrowband path, respectively, the impedance means comprising switch means for disconnecting the narrowband path from the current-steering node, the impedance means configured to steer the low-frequency wideband signal to the wideband path, the wideband filter means configured to pass the low-frequency wideband signal to the first output node.

19. The apparatus of claim 18, wherein:
the low-frequency wideband signal has a wide bandwidth that is greater than approximately 100 megahertz; and
the low-frequency narrowband signal has a narrow bandwidth that is less than approximately 100 megahertz.

20. A method for current-mode filtering using current steering, the method comprising:
accepting an input current comprising at least a high-frequency narrowband signal and a low-frequency narrowband signal at a current-steering node;
steering the high-frequency narrowband signal to a wideband path including a wideband transimpedance amplifier, the wideband path coupled between the current-steering node and a first output node;
steering the low-frequency narrowband signal to a narrowband path including a narrowband transimpedance amplifier, the narrowband path coupled between the current-steering node and a second output node;
passing the high-frequency narrowband signal to the first output node; and
passing the low-frequency narrowband signal to the second output node.

21. The method of claim 20, further comprising:
accepting another input current comprising a wideband signal at the current-steering node;
disconnecting the narrowband path from the current-steering node;
steering the wideband signal to the wideband path; and
passing the wideband signal to the first output node.

22. The method of claim 20, further comprising performing carrier aggregation based on the passing of the high-frequency narrowband signal to the first output node and the passing of the low-frequency narrowband signal to the second output node.

23. An apparatus comprising:
an antenna; and
a receiver including:
a low-noise amplifier coupled to the antenna;
a mixer coupled to the low-noise amplifier;
at least one analog-to-digital converter; and
a filter including a current-steering node coupled to the mixer, a wideband path including a wideband transimpedance amplifier, a narrowband path including a narrowband transimpedance amplifier, and at least one output node respectively coupled to the at least one analog-to-digital converter; the wideband path and the narrowband path coupled between the current-steering node and the at least one output node;
the filter configured to selectively have:
a wideband low-pass response via the wideband path at a first time; and
a narrowband low-pass response via the narrowband path at a second time.

24. The apparatus of claim 23, wherein:
the filter includes a switch coupled between the current-steering node and the narrowband path, the switch configured to selectively be in:
an open state at the first time to cause the wideband path to have the wideband low-pass response at the first time; and
a closed state at the second time to cause the narrowband path to have the narrowband low-pass response.

25. The apparatus of claim 24, wherein the filter is configured to have a band-pass response via the wideband path at the second time based on the switch being in the closed state.

26. The apparatus of claim 25, wherein:
the antenna is configured to:
  receive a low-frequency wideband signal at the first time and at least a low-frequency narrowband signal at the second time; and
  provide currents respectively associated with the low-frequency wideband signal at the first time and with the low-frequency narrowband signal at the second time;
the low-noise amplifier is configured to amplify the currents;
the mixer is configured to downconvert the currents from a radio frequency to a baseband frequency;
the filter is configured to selectively:
  pass the low-frequency wideband signal to the at least one output node via the wideband path at the first time based on the switch being in the open state; and
  pass the low-frequency narrowband signal to the at least one output node via the narrowband path at the second time based on the switch being in the closed state;
the at least one analog-to-digital converter is configured to:
  digitize the low-frequency wideband signal at the first time; and
  digitize the low-frequency narrowband signal at the second time.

27. The apparatus of claim 26, wherein:
the antenna is configured to:
  receive both the low-frequency narrowband signal and at least a high-frequency narrowband signal at the second time; and
  provide the currents respectively associated with the low-frequency narrowband signal and the high-frequency narrowband signal at the second time;
the low-noise amplifier is configured to amplify the currents;
the mixer is configured to downconvert the currents from the radio frequency to the baseband frequency;
the filter is configured to pass the high-frequency narrowband signal to the at least one output node via the wideband path at the second time based on the switch being in the closed state; and
the at least one analog-to-digital converter is configured to digitize both the low-frequency narrowband signal and the high-frequency narrowband signal at the second time.

28. An apparatus comprising:
a filter including:
  a current-steering node;
  a first output node and a second output node;
  a wideband path coupled between the current-steering node and the first output node, the wideband path including a wideband low-pass filter configured to pass frequencies within a wide passband; and
  a narrowband path coupled between the current-steering node and the second output node, the narrowband path including a narrowband low-pass filter configured to pass a portion of the frequencies that are within a narrow passband, the narrowband low-pass filter configured to have an impedance, the wideband low-pass filter configured to have another impedance that is larger within the narrow passband and smaller within a portion of the wide passband that is outside of the narrow passband relative to the impedance of the narrowband low-pass filter.

* * * * *